United States Patent [19]
Moskovits et al.

[11] Patent Number: 6,129,901
[45] Date of Patent: Oct. 10, 2000

[54] CONTROLLED SYNTHESIS AND METAL-FILLING OF ALIGNED CARBON NANOTUBES

[75] Inventors: Martin Moskovits, 145 Chiltern Hill, Toronto, Canada, M6C 3C3; Jing Li, 255 Glenlake Ave. App.1504, Toronto, Canada, M6P 1G2; Thomas L. Haslett, Toronto, Canada

[73] Assignees: Martin Moskovits; Jing Li; Thomas Haslett, all of Toronto, Canada

[21] Appl. No.: 09/186,092

[22] Filed: Nov. 5, 1998

Related U.S. Application Data

[60] Provisional application No. 60/065,692, Nov. 18, 1997.

[51] Int. Cl.$^7$ .................................................... D01F 9/127
[52] U.S. Cl. .................... 423/447.3; 423/439; 423/447.5
[58] Field of Search ............................. 423/447.3, 447.2, 423/445 B, 447.5, 439

[56] References Cited

U.S. PATENT DOCUMENTS

| | | | |
|---|---|---|---|
| 4,472,533 | 9/1984 | Mosakovits | 502/320 |
| 5,693,207 | 12/1997 | Fromson | 502/439 |

FOREIGN PATENT DOCUMENTS

| | | |
|---|---|---|
| 281364 | 9/1988 | European Pat. Off. . |

OTHER PUBLICATIONS

Muller et al., "Synthesis of Nanotubes via Catalytic Pyroysis of Acetylene: A Sem Study", *Pergamon*, vol. 35, No. 7, 1997, pp. 951–966.

Dai et al., "Nanotubes as nanoprobes in Scanning Probe Microscopy", *Nature*, vol. 38, Nov. 14, 1996, pp. 147–150.

D. Ugarte et al., "Nanocapillarity and Chemistry in Carbon Nanotubes", *Science*, vol. 274, Dec. 18, 1996, pp. 1897–1899.

E. Dujardin et al., "Capillarity and Wetting of Carbon Nanotubes", *Science*, vol. 265, Sep. 23, 1994, pp. 1850–1852.

P.M. Ajayan et al., "Opening Carbon Nanotubes with Oxygen and Implications for Filling", *Nature* vol. 362, Apr. 8, 1993, pp. 522–525.

C. Guerret–Piecourt et al., "Relation Between Metal Electronic Structure and Morphology of Metal Compounds Inside Carbon Nanotubes", *Nature* vol. 372, Dec. 22–29, 1994, pp. 761–765.

V. Ivanov et al., "The Study of Carbon Nanotubes Produced by Catalytic Method", *Chemical Physics Letters*, vol. 223, 1994, pp. 329–335.

P.M. Ajayan et al., "Capillarity–Inducing fliling of Carbon Nanotubes", *Nature*, vol. 361, Jan. 28, 1993, pp. 333–334.

S.C. Tsang et al., "A Simple Chemical Method of Opening and Filling Carbon Nanotubes", *Nature*, vol. 372, Nov. 10, 1994, pp. 159–162.

Y. Murakami et al., "Structural, Magnetic and Superconducting Properties of Graphite Nanotubes and Their Encapsulation Compounds", *Pergamon*, vol. 54, No. 12, 1993, pp. 1861–1870.

(List continued on next page.)

*Primary Examiner*—Steven Bos
*Assistant Examiner*—Peter DiMauro
*Attorney, Agent, or Firm*—Lynn C. Schumacher; Hill & Schumacher

[57] ABSTRACT

The present invention provides a powerful new method for producing, uniform sized and uniformly aligned nanotubes through catalytic pyrolysis of a hydrocarbon within the dense, uniform and parallel pores of alumina nanotemplates. The catalyst, Co, Fe, Ni or another suitable substance is deposited electrochemically into the bottom of the channel of the alumina template. The nanotubes with any desired diameter in the range 5–500 nm and lengths up to ~100 μm, are generated by the pyrolysis of a suitable hydrocarbon inside the pores of the alumina template with at least one end open at the alumina/air interface. The nanotubes may be filled by metals using for example electroless deposition.

23 Claims, 5 Drawing Sheets

OTHER PUBLICATIONS

S. Lijima, "Helical Microtubules of Graphitic Carbon", *Nature*, vol. 354, Nov. 7, 1991, pp. 56–58.

Morinobu Endo et al., "The Production and Structure of Pyrolytic Carbon Nanotubes (PCNTs)", *Pergamon*, vol. 54, No. 12, 1994, pp. 1841–1848.

W.Z. Li, et al., "Large–Scale Synthesis of Aligned Carbon Nanotubes", *Science*, vol. 275, Dec. 6, 1996, pp. 1701–1703.

M. Terrones et al., "Controlled Production of Aligned–Nanotube Bundles", *Nature*, vol. 388, Jul. 3, 1997, pp. 52–55.

Takashi Kyotani et al., "Preparation of Ultrafine Carbon Tubes in Nanochannels of an Anodic Aluminum Oxide Film", *American Chemical Society*, vol. 8, No. 8, 1996, pp. 2109–2113.

Yahachi Saito et al., "Carbon Nanocapsules Encaging metals and Carbides", *Pergamon*, vol. 54, No. 12, 1994, pp.1849–1860.

Martin, Charles R., "Nanomaterials: A Membrane–Based Synthetic Approach", *Science*, vol. 266, Dec. 23, 1994, pp. 1961–1968.

Kyotani et al., "Formation of Platinum Nanorods and Nanoparticles in Uniform Carbon Nanotubes Prepared by a Template Carbonization Method", *Chemistry Community*, 1997, pp. 701–702.

Kyotani et al., "Formation of Ultrafine Carbon Tubes by Using an Anodic Aluminum Oxide Film as a Template", *Chemistry of Materials*, vol. 7, No. 8, American Chemical Society, Aug. 1995, pp. 1427–1428.

SEM image of exposed carbon nanotubes after etching partially away template surface by NaOH solution.

Electron diffraction pattern of carbon nanotubes

Electron diffraction pattern of nickel filled carbon nanotubes

TEM images of carbon nanotubes

TEM images of nickel filled carbon nanotubes

TEM images of a) Ni-P alloy encapsulated within the carbon nanotubes, b, d) High resolution images of the interface of Ni-P alloy and carbon, and c) Ni-p alloy

CONTROLLED SYNTHESIS AND METAL-FILLING OF ALIGNED CARBON NANOTUBES

CROSS REFERENCE TO RELATED UNITED STATES PATENT APPLICATION

This patent application relates to United States Provisional Application Serial No. 60/065,692 filed on Nov. 18, 1997, entitled CONTROLLED SYNTHESIS AND METAL-FILLING OF ALIGNED CARBON NANOTUBES.

FIELD OF THE INVENTION

The present invention relates to a method of synthesis of aligned carbon nanotubes through catalytic pyrolysis of hydrocarbon within alumina nano-templates. The present invention also relates to a method of filling the inner cavity of the nanotubes with metals and more particularly the method relates to electroless plating of metals including but not limited to Ni, Co, their alloys and other metals into the inner cavity of the nanotubes and filling the metals inside.

BACKGROUND OF THE INVENTION

Carbon nanotube, a novel carbon material, was theoretically predicted and experimentally shown to possess unique electronic and mechanical properties and is of great scientific and potential commercial value. Recent studies reveal that the diameter, number of concentric cylinders and helicity of the arrangement of the carbon atoms in the nanotube shell determine whether the nanotube has metallic, semiconducting or insulating properties. Hence a wide range of materials properties may be "tuned in" by changing the structural properties of these nanotubes. The stiffness and high strength of these carbon nanotubes make them ideal probes in scanning probe microscopy, and efficient field-emitters, as recently shown by Smalley's group. Additionally the inner hollow cavity of the nanotubes may serve as nanometer scale test tubes in which to carry out interesting experiments with submicroscopic quantities of reagents. Nanotubes filled with metallic or semiconducting particles might serve as the constituents of novel materials with useful magnetic, electrical or electronic properties leading to new devices.

The conventional synthesis methods for carbon nanotube include carbon arc discharge (S. Iijima, *Nature*, 354, 56, 1991) and catalytic pyrolysis of hydrocarbon (M. Endo, K. Takeuchi, S. Igarashi, K. Kobori, M. Shiraishi, H. W. Kroto, *J. Phys. Chem. Solids*, 54, 1841, 1993), which generate nanotubes often containing traces of the catalyst particles used to generate them and possessing highly variable dimensions. Synthesis of aligned nanotube by pyrolysis of hydrocarbon with a patterned cobalt catalyst on silica substrate was recently reported by M. Terrones et al, *Nature*, 388, 52, 1997 and with iron nanoparticles in mesoporous silica by W. Z. Li et al, *Science*, 274, 1701, 1996. The successful production of carbon nanotubes in an alumina template by pyrolysis of propylene has been disclosed by T. Kyotani, L. Tsai, A. Tomita, *Chem. Mater.*, 8, 2190, 1996.

The encapsulation of foreign materials in the carbon nanotubes has been disclosed by P. M. Ajayan and S. Iijima (U.S. Pat. No. 5,457,343). Ni, Fe, Co, rare earth metals and their carbides were found to be encapsulated in the nanotubes during synthesis of them in carbon arc discharge by Y. Saito et al, *J. Phys. Chem. Solids*, 54, 1849, 1993, and also by C. Guerret-Piecout et al, *Nature*, 372, 761, 1994. The metals with a low melting point, such as lead, zinc, selenium, and molten metal salt, $AgNO_3$ were filled through capillarity into the carbon nanotubes, reported by P. M. Ajayan et al, *Nature*, 362, 522, 1993, E. Dujardin et al, *Science* 265, 1850, 1994 and by D. Ugarte et al, *Science*, 274, 1897, 1996.

SUMMARY OF THE INVENTION

It is an object of the present to provide a method of producing carbon nanotubes of uniform size and uniformly aligned in the axial direction.

The present invention provides a powerful new method for producing, uniform sized and uniformly aligned nanotubes through catalytic pyrolysis of a hydrocarbon within the dense, uniform and parallel pores of alumina nano-emplates. The catalyst, Co, Fe, Ni or another suitable substance is deposited electrochemically into the bottom of the channel of the alumina template. The nanotubes with any desired diameter in the range 5–500 nm and lengths up to ~100 $\mu$m, are generated by the pyrolysis of a suitable hydrocarbon inside the pores of the alumina template with at least one end open at the alumina/air interface.

The present invention provides a process for filling the carbon nanotubes obtained by above method with metal Ni, Co, Fe, Ag and their alloys by electroless (chemical) plating.

In one aspect of the invention there is provided a process for synthesis of carbon nanotube. The method comprises anodizing an aluminum substrate in an effective bath to produce an alumina template with a plurality of pores each having a pore diameter. The method includes depositing an effective catalyst into the pores and exposing the alumina template with the catalyst containing pores to an effective hydrocarbon gas at an effective temperature to grow carbon nanotubes in the pores. Each carbon nanotube has an outer diameter not greater than to the pore diameter in the template in which the carbon nanotube is produced.

In another aspect of the invention there is provided a process for producing metal containing carbon nanotubes, comprising:

a process for producing metal containing carbon nanotubes, comprising:
anodizing an aluminum substrate in an effective bath to produce an alumina template with a plurality of pores each having a pore diameter;
depositing an effective catalyst into the bottom of the pores; exposing the alumina template with the catalyst containing pores to an effective hydrocarbon gas at an effective temperature to grow carbon nanotubes in the pores, each carbon nanotube having an outer diameter not greater than to the pore diameter in the template in which the carbon nanotube is produced; and
depositing a metal into the nanotubes.

In this aspect of the invention the metal may be deposited into the nanotube by electroless deposition.

BRIEF DESCRIPTION OF THE DRAWINGS

The process of growth of carbon nanotubes and metal filling of the nanotubes will now be described, by way of example only, reference being had to the accompanying drawings, in which.

DETAILED DESCRIPTION OF THE INVENTION

Figure 1:
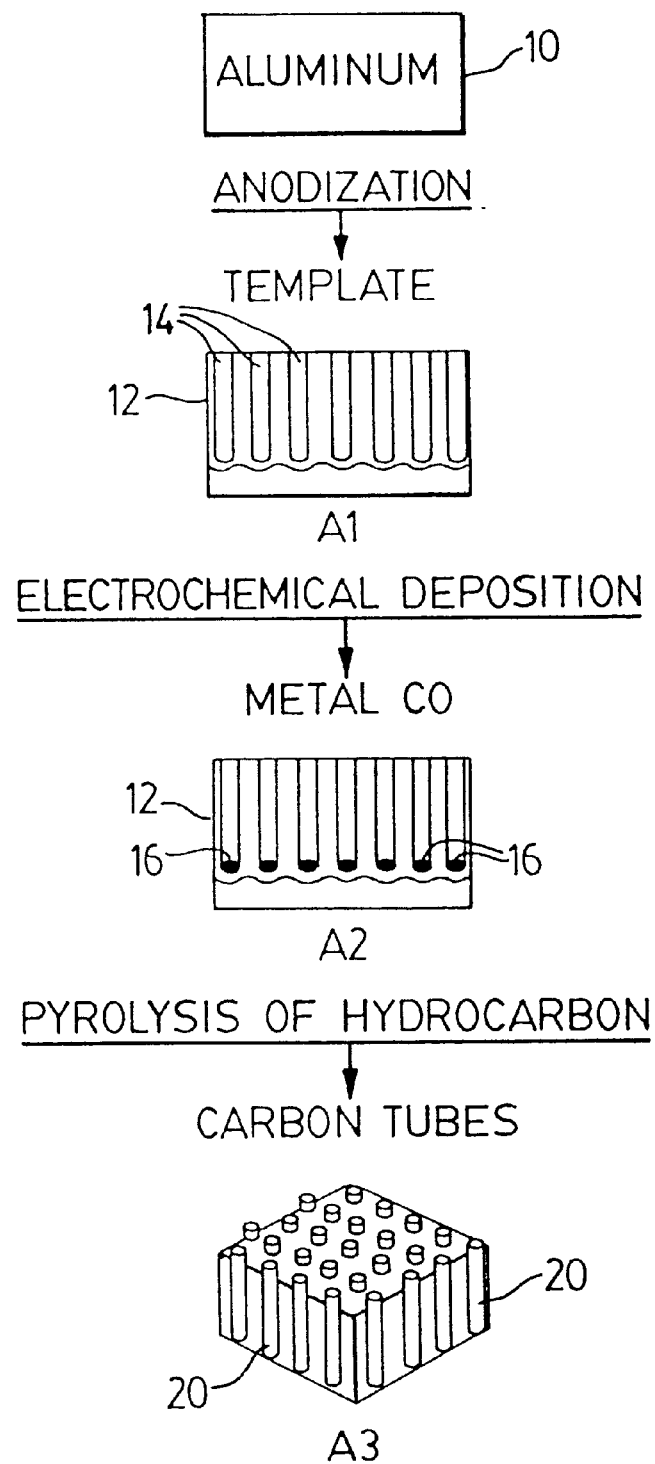
FIG. 1 is a schematic diagram showing the steps of synthesising carbon nanotubes in accordance with the present invention.

The process of synthesizing carbon nanotubes is showed schematically in FIG. 1. Anodic oxidation of an aluminum (99.99%) substrate 10 was carried out in 0.3 M of oxalic acid bath at cell voltages of 25, 40, 50 and 65 V respectively at 18° C. While the oxalic acid bath is preferred, other anodizing electrolyte media such as sulphuric, phosphoric and chromic acids may also be used. In these examples the film thickness was controlled to lie in the range 4–10 $\mu$m by selecting the anodic oxidation time appropriately. Under the present experimental conditions, the film thickness is calculated using the formula: $D=\alpha Itl/A$; where a is an experimentally determined constant equal to 0.017 $\mu$m/(mA cm$^{-2}$ min); $I$ is the anodizing current in mA; $t$ is the anodizing time in minutes, and A is the aluminum sample area in cm$^2$. Films in the range 1–100 $\mu$m may be generated in this way. The anodized alumina templates 12 were immersed in 0.1 M phosphoric acid at 30° for 30 min. to widen the pores and to thin the barrier layer. After widening, the average pore diameter of the pores 14 in template 12 obtained at cell voltages of 25, 40, 50 and 65 V are 20, 35, 50 and 70 nm, respectively. The pores 14 are straight, uniform and parallel as shown in the diagrammatic representation in FIG. 1.

A cobalt (or iron) catalyst sample 16 approximately 200 nm in length was electrochemically deposited at the bottom of the pores using 14 V and 100 Hz of AC cell voltage for 30 seconds in a bath consisting of 240 g/l of CoSO$_4$•7H$_2$O, (or 120 g/l of FeSO$_4$•7H$_2$O) 40 g/l of HBO$_3$ and 1 g/l of ascorbic acid. The cobalt-containing templates 12 were placed in a tube furnace and reduced at 600° C. for 4–5 hours in flowing CO (100 ml/min). Then a mixture of 10% acetylene in nitrogen was introduced into the reactor at a flow rate of 100 ml/min. Acetylene was decomposed by pyrolysis in the temperature range 640° C. to 700° C. to form the carbon nanotubes 20 in the template channels. While this is a preferred temperature range the acetylene may be decomposed in a range from 600° C. to about 800° C. In addition to acetylene, it will be understood that other hydrocarbon containing gases may be used, for example propylene and methane to mention just a few.

Figure 2:
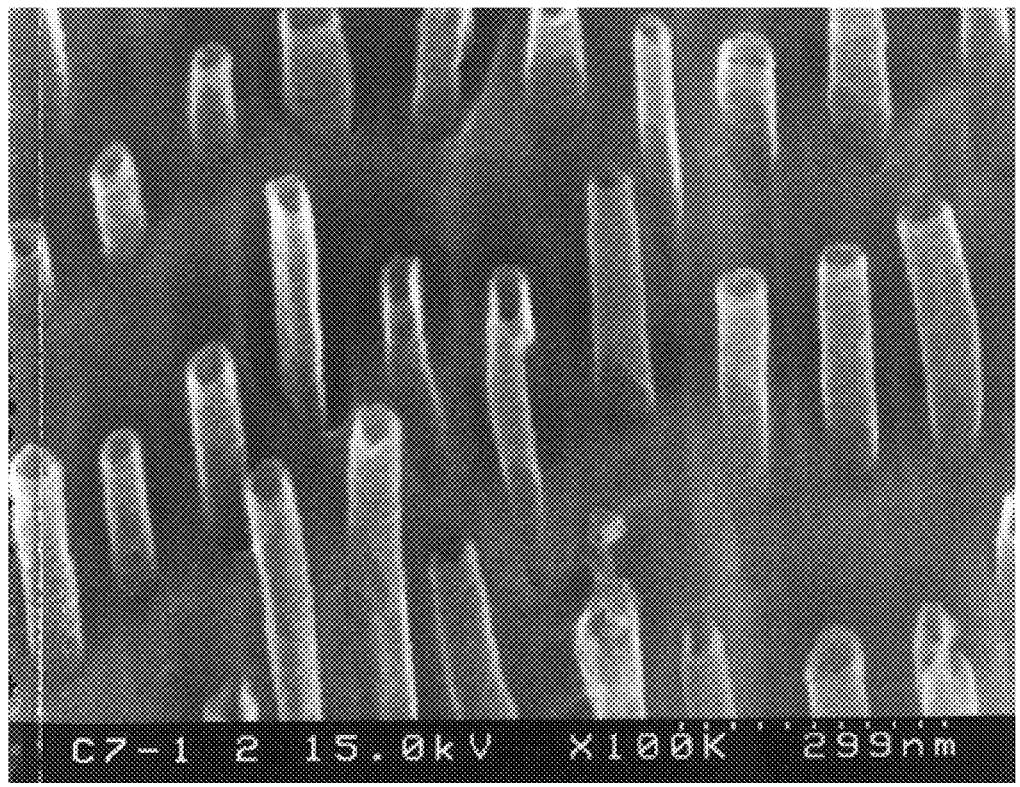
FIG. 2 is a scanning electron micrograph (SEM) of exposed carbon nanotubes after etching partially away the template surface in an NaOH solution.
Figure 3A:
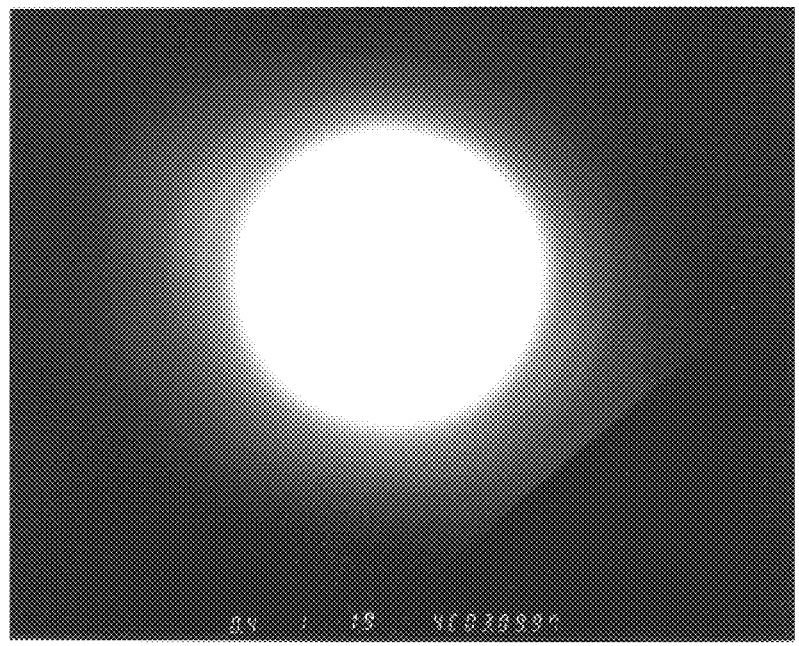
FIG. 3a shows an electron diffraction pattern of carbon nanotubes produced according to the present invention.
Figure 4A:
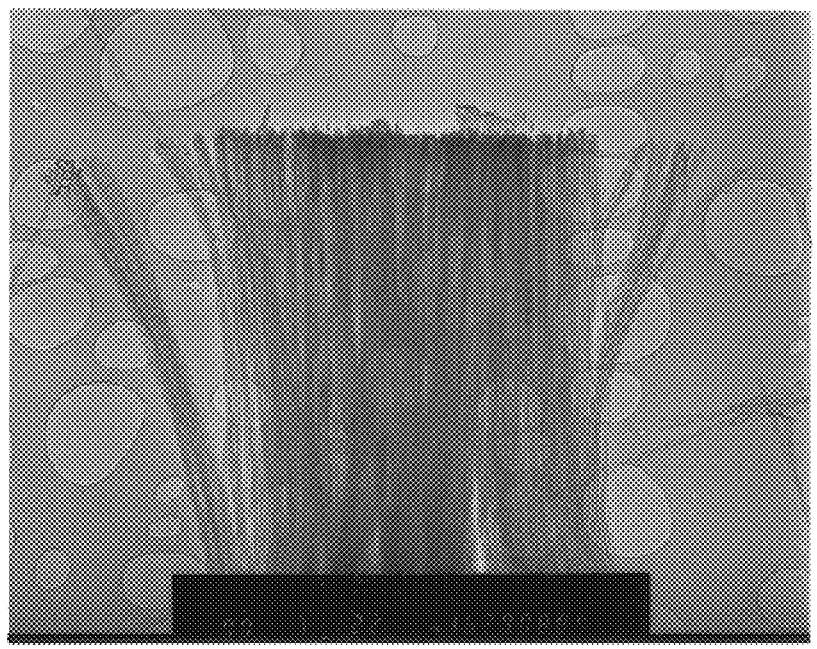
FIG. 4a shows a transmission electron micrograph (TEM) of carbon nanotubes produced by the present method.

After formation, the nanotubes 20 were annealed to further graphitize the tubes at 700° C. in flowing nitrogen for 15 hours. FIG. 2 shows SEM image of the nanotubes whose ends were exposed by partially etching the alumina template with a NaOH solution. The nanotubes 20 are perpendicular to the template 12. Their ends at the alumina/air interface are open and their outer diameters correspond to the inner diameters of the pores 14. An electron diffraction pattern (FIG. 3a) recorded for a bundle of the nanotubes that had been released from the alumina template by dissolving the latter in a NaOH solution, (FIG. 4a) reveals an ordered graphitic arrangement within the bundles. The inter-layer spacing in the 002 direction ($d_{002}$) deduced from the electron diffraction data is approximately 3.45 nm, which is close that value in graphite ($d_{002}$=3.35 nm).

Electroless nickel deposits were produced in an acid bath consisting of 30 g/l of nickel chloride, 10 g/l of sodium hypophosphite, 50 g/l of sodium acetate and ammonia to pH=5. The alumina templates containing carbon nanotubes were washed with acetone then with distilled water. The washed templates were dipped in the electroless deposition bath for 20–30 min at 25–40° C. The reaction producing the nickel deposit can be formulated as:

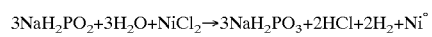

$$3NaH_2PO_2+3H_2O+NiCl_2 \rightarrow 3NaH_2PO_3+2HCl+2H_2+Ni°$$

Figure 3B:
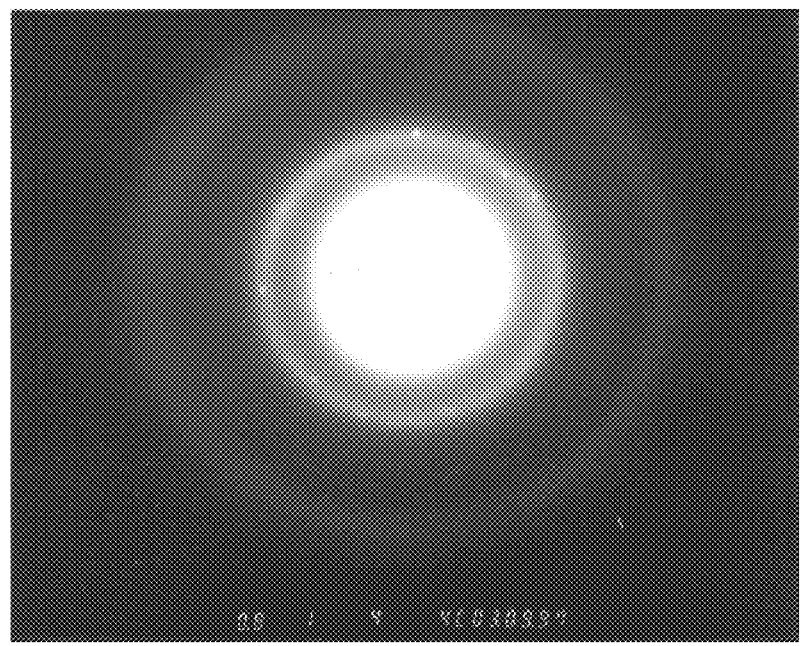
FIG. 3b shows an electron diffraction pattern of nickel filled carbon nanotubes.
Figure 4B:
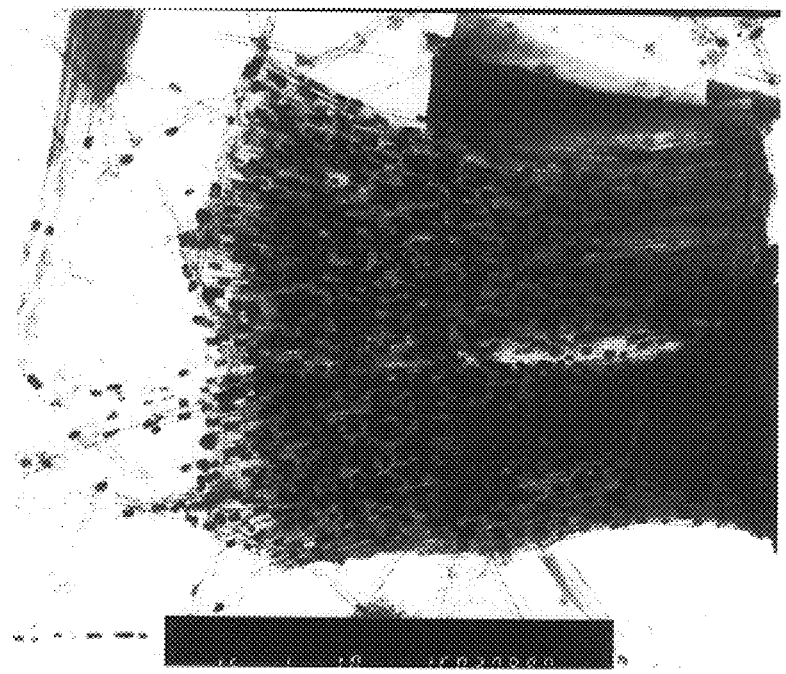
FIG. 4b shows a TEM of nickel filled carbon nanotubes.
Figure 5A:
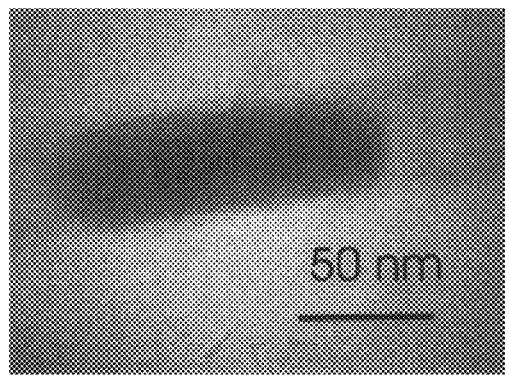
FIG. 5a shows transmission electron micrographs of Ni-P alloy encapsulated within the carbon nanotubes.
Figure 5B:
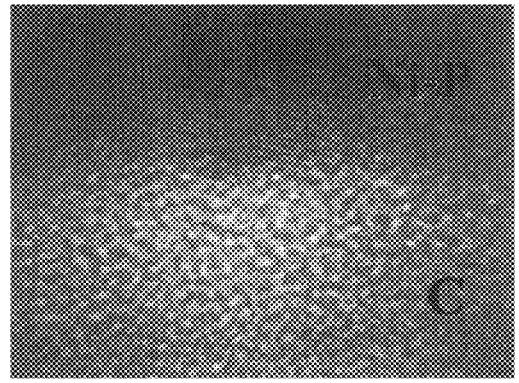
FIGS. 5b and 5d show high resolution images of the interface of Ni-P alloy and carbon.
Figure 5C:
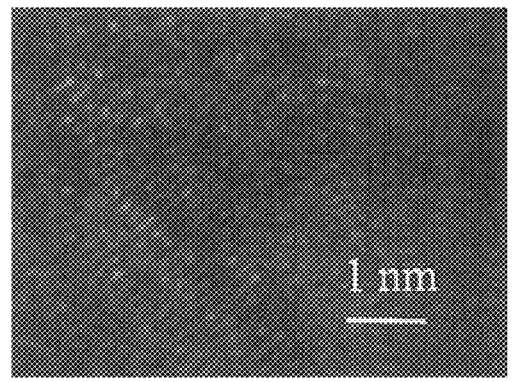
FIG. 5c shows a high resolution TEM of Ni-P alloy.
Figure 5D:
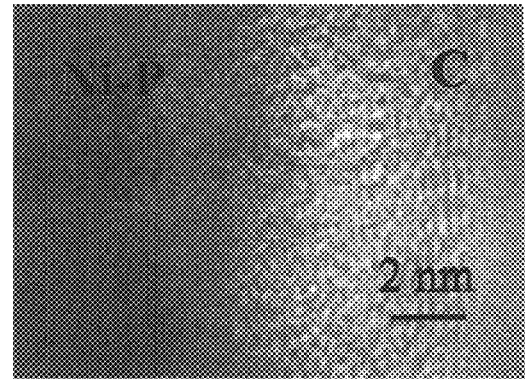

It was found that addition of 0.5 g/l of quinhydrone improved the deposition. The quinhydrone may function as a surfactant to increase the wetting of the walls of nanotubes by the solution and as a pH stabilizing agent. Other surfactants, such as gelatine, Dodecyl sulfate sodium salt, are also anticipated to improve the wetting efficacy of the deposition solution. After completely dissolving the alumina template using 0.1 M NaOH solution at 60–80° C., the metal-containing nanotubes (FIG. 4b) could be separated as an insoluble precipitate. An electron diffraction pattern (FIG. 3b) recorded for the bundle of nickel-containing nanotubes exhibits clear diffraction spots corresponding to Nickel metal, which coincidentally almost overlaps the diffraction rings produced by the carbon layers of the nanotubes due to the near-correspondence of some of the lattice constants. A lattice constant of approximately 3.52 nm is obtained from the electron diffraction pattern of the deposited metal. The high-resolution TEM image (FIG. 5) shows that the deposited metal is highly crystalline. An EDX analysis of the metal encapsulated in the nanotubes shows it to be a nickel/phosphorous mixture with an average Ni/P ratio of 94% Ni and 6% P.

While nickel, cobalt and iron are preferred catalysts for deposition into the pores of the anodized aluminum template for growth of the carbon nanotubes, it is anticipated by the inventors that other suitable or effective catalysts may be used. For example, the metals below each of these three preferred metals are reasonably expected to work to some degree.

Similarly, those skilled in the art will appreciate that numerous other metals may be deposited into the carbon nanotubes once formed. Examples include metals such as Ag, Cu, Bi, Pb and Sn may be deposited into the nanotubes by electroless deposition. It will also be understood by those skilled in the art that the nanotubes may be filled with the metals by electrochemical deposition.

The present method is highly advantageous over prior art methods of growing carbon tubes since in prior art methods the lack of catalyst in the pores yields tubes that exhibit poor uniformity along the tube axis due to the influence of diffusion of the gaseous reagents into and out of the pores of the template.

In the present method, it is not necessary to strip off the oxide film from the aluminum plate so that a thin film, i.e. a film that is not self-supporting, can also be used as a template allowing one to make tubes of any desired length, by using templates of the appropriate thickness in the practical range 0.1 $\mu$m to over 100 $\mu$m, in contrast to the method described by Kyotani et al. (*Chem. Mater.*, 8,2190, 1996), that requires self-supporting templates and hence is incapable of making tubes below a minimum length below which the template is no longer self-supporting. The present method also provides a much more economical method of growing nanotubes since the number of procedural steps is decreased. The carbon nanotubes resulting from catalytic, thermal decomposition result in the growth of much more uniform tubes in the pores in contrast to tubes grown in templates without catalyst.

The foregoing description of the preferred embodiments of the process for producing carbon nanotubes has been presented to illustrate the principles of the invention and not to limit the invention to the particular embodiments disclosed. It is intended that the scope of the invention be defined by all of the embodiments encompassed within the following claims and their equivalents.

We claim:

1. A process for synthesis of carbon nanotubes, comprising:
    anodizing an aluminum substrate in an effective bath to produce an alumina template with a plurality of pores each having a pore diameter;
    depositing an effective catalyst into the pores; and
    exposing said alumina template with the catalyst containing pores to an effective hydrocarbon gas at an effective temperature to grow carbon nanotubes in said pores, each carbon nanotube having an outer diameter not greater than the pore diameter in the template in which said carbon nanotube is produced.

2. The process according to claim 1 wherein the aluminum substrate is anodized under conditions effective to produce said plurality of pores substantially parallel to each other.

3. The process according to claim 2 wherein said aluminum substrate is anodized in an effective acid bath.

4. The process according to claim 3 wherein said catalyst is selected from the group consisting of Co, Fe, Ni and alloys thereof.

5. The process according to claim 4 wherein said catalysts are electrochemically deposited into said pores.

6. The process according to claim 5 wherein said hydrocarbon gas comprises acetylene.

7. The process according to claim 6 wherein said hydrocarbon gas is pyrolized in a temperature range from about 600° C. to about 800° C.

8. The process according to claim 7 wherein subsequent to producing said carbon nanotubes, said carbon nanotubes are annealed to further graphitize said nanotubes.

9. The process according to claim 8 including depositing a metal into said nanotubes.

10. The process according to claim 9 wherein said metal deposited into said nanotubes is selected from the group consisting of Ni, Fe, Co and Ag.

11. The process according to claim 10 wherein said metal is deposited into said nanotubes by electroless deposition from an effective electroless deposition bath.

12. The process according to claim 10 wherein said metal is deposited into said nanotubes by electrochemical deposition.

13. The process according to claim 11 wherein said electroless deposition bath comprises a surfactant selected from the group consisting of quinhydrone, gelatine and dodecyl sulfate sodium salts as additives for improving the electroless deposition of said metal.

14. The process according to claim 2 including immersing the alumina substrate in an effective solution to widen said pores and thin an alumina barrier layer on the interior surface of said pores.

15. The process according to claim 11 wherein said nanotubes are washed prior to electroless deposition of said metals.

16. The process according to claim 9 including dissolving the alumina template to separate the carbon nanotubes from said template.

17. The process according to claim 16 wherein said alumina template is dissolved in an NaOH solution.

18. The process according to claim 17 wherein the metal-containing nanotubes are separated as an insoluble precipitate.

19. A process for producing metal containing carbon nanotubes, comprising:
    anodizing an aluminum substrate in an effective bath to produce an alumina template with a plurality of pores each having a pore diameter;
    depositing an effective catalyst into the bottom of the pores;
    exposing said alumina template with the catalyst containing pores to an effective hydrocarbon gas at an effective temperature to grow carbon nanotubes in said pores, each carbon nanotube having an outer diameter not greater than the pore diameter in the template in which said carbon nanotube is produced; and
    depositing a metal into said nanotubes.

20. The process according to claim 19 wherein said metal is deposited into said nanotube by electroless deposition.

21. The process according to claim 20 wherein said catalyst is selected from the group consisting of Ni, Co and Fe.

22. The process according to claim 21 wherein said metal deposited into said nanotubes by electroless deposition includes a metal selected from the group consisting of Ni, Co, Fe, Ag and their alloys.

23. The process according to claim 21 wherein said metal deposited into said nanotubes by electroless deposition includes a metal selected from the group consisting of Ag, Cu, Bi, Pb and Sn.

* * * * *